United States Patent
Belanger, Jr.

[11] Patent Number: 5,969,418
[45] Date of Patent: Oct. 19, 1999

[54] METHOD OF ATTACHING A CHIP TO A FLEXIBLE SUBSTRATE

[75] Inventor: Thomas Dudley Belanger, Jr., Saline, Mich.

[73] Assignee: Ford Motor Company, Dearborn, Mich.

[21] Appl. No.: 08/996,352

[22] Filed: Dec. 22, 1997

[51] Int. Cl.[6] .......... H01L 23/48; H01L 23/053; H01L 23/12

[52] U.S. Cl. .......... 257/737; 257/701; 228/180.22; 438/613

[58] Field of Search ................ 257/737, 738, 257/778, 784, 701; 228/180.22; 438/613

[56] References Cited

U.S. PATENT DOCUMENTS

| | | | |
|---|---|---|---|
| 4,700,214 | 10/1987 | Johnson | 257/774 |
| 4,940,181 | 7/1990 | Juskey, Jr. et al. | 361/774 |
| 5,329,423 | 7/1994 | Scholz | 257/695 |
| 5,384,435 | 1/1995 | Fuerst et al. | 174/262 |
| 5,401,911 | 3/1995 | Anderson et al. | 174/266 |
| 5,465,306 | 11/1995 | Feigenbaum | 382/276 |
| 5,801,350 | 9/1998 | Shibuya et al. | 29/840 |
| 5,828,128 | 10/1998 | Higashiguchi et al. | 257/738 |

*Primary Examiner*—Mahshid Saadat
*Assistant Examiner*—Jhihan B Clark
*Attorney, Agent, or Firm*—Leslie C. Hodges

[57] ABSTRACT

There is disclosed herein an electronic circuit, one embodiment of which comprises: an electronic component 10 having bump terminations 12 on a first surface 14 thereof; a flexible substrate 16 having a plurality of generally round holes 18 therein arranged in correspondence with the bump terminations, wherein each hole has a diameter d smaller than the diameter D of a corresponding bump termination; and an array of conductive circuit traces 20 arranged on a second surface 22 of the substrate, wherein each of the circuit traces terminates generally about one of the holes in the substrate. Each bump termination 12 is fixably inserted into its corresponding substrate hole 18 so as to mechanically connect the electronic component 10 with the substrate 16 and to electrically connect each termination 12 with a corresponding circuit trace 20.

20 Claims, 3 Drawing Sheets

METHOD OF ATTACHING A CHIP TO A FLEXIBLE SUBSTRATE

BACKGROUND OF THE INVENTION

1. Field of the Invention

The present invention relates generally to electronic components, and more particularly to a method of attaching an electronic component to a flexible substrate.

2. Disclosure Information

Ball grid array (BGA) chips are surface mount electronic components having ball-shaped "bump" terminations on a bottom surface thereof. These terminations are typically formed by a process known as "ball bumping", which is well known in the art of electronics manufacturing. The bumps may be made of a metal (e.g., gold, aluminum) having a melting point well above any processing temperatures to which the BGA will be exposed, or they may be made of solder (e.g., eutectic tin/lead). In the former case, the bumps may optionally be provided with an outer coating of solder.

BGA chips are typically attached to circuit traces on a substrate by one of three approaches, as illustrated in FIG. 1. The first approach involves providing a BGA 70 having eutectic solder bump terminations 73 with flux 74 applied atop the corresponding circuit trace mounting pads 76, the second approach involves providing a BGA 71 having gold or other high-melting-point metal bumps 75 with solder paste 78 (i.e., solder plus flux) applied atop the mounting pads 76, and the third approach involves providing a BGA 72 having gold/other metal bumps 75 coated with solder 73 with flux 74 applied atop the mounting pads 76. In each approach, the EGA 70/71/72 is placed on the substrate 77 with the bumps 73/75 resting atop their respective circuit trace mounting pads 76 (amid flux 74 or solder paste 78), and then the entire assembly is shuttled through a reflow oven in order to melt, flow, and solidify the solder so as to mechanically and electrically connect each termination with its respective circuit trace.

BGAs are usually attached to rigid, flat, planar substrates made of FR-4 glass/epoxy composite or similar materials, although in some applications BGAs may instead be attached to flexible substrates made of polyimide, polyester, or other like materials. However, flexible substrates are much more sensitive than rigid FR-4 substrates to the elevated temperatures to which the assembly is exposed during reflow. Such elevated temperatures may cause thermal degradation and other problems in the flexible substrate material.

Various methods have been proposed for protecting the flexible substrate from excessive thermal exposure during reflow processing. However, it would be desirable to provide a method for attaching a EGA to a flexible substrate without having to subject the substrate/BGA assembly to the reflow process at all.

SUMMARY OF THE INVENTION

The present invention overcomes the disadvantages of the prior art by providing a method for connecting a bump-terminated surface mount component such as a BGA chip to a flexible substrate without relying on reflow or other elevated temperature processing methods. The invention is an electronic circuit and method of making the same, one embodiment of which comprises: an electronic component having bump terminations on a first surface thereof; a flexible substrate having a plurality of generally round holes therein arranged in correspondence with the bump terminations, wherein each hole has a diameter smaller than the diameter of a corresponding bump termination; and an array of conductive circuit traces arranged on a second surface of the substrate, wherein each of the circuit traces terminates generally about one of the holes in the substrate. Each bump termination is fixably inserted into its corresponding substrate hole so as to mechanically connect the electronic component with the substrate and to electrically connect each termination with a corresponding circuit trace.

It is an object and advantage that the present invention provides a method of attaching a bump-terminated electronic component to a flexible substrate without exposing the component/substrate assembly to elevated processing temperatures.

Another advantage is that the present invention may be utilized with conventional bump-terminated chips and flexible substrates with minimal modification.

A further advantage is that the present invention may produce bonded component/substrate assemblies faster and more economically than may be done with conventional reflow processing.

These and other advantages, features and objects of the invention will become apparent from the drawings, detailed description and claims which follow.

DETAILED DESCRIPTION OF THE PREFERRED EMBODIMENTS

Figure 1:
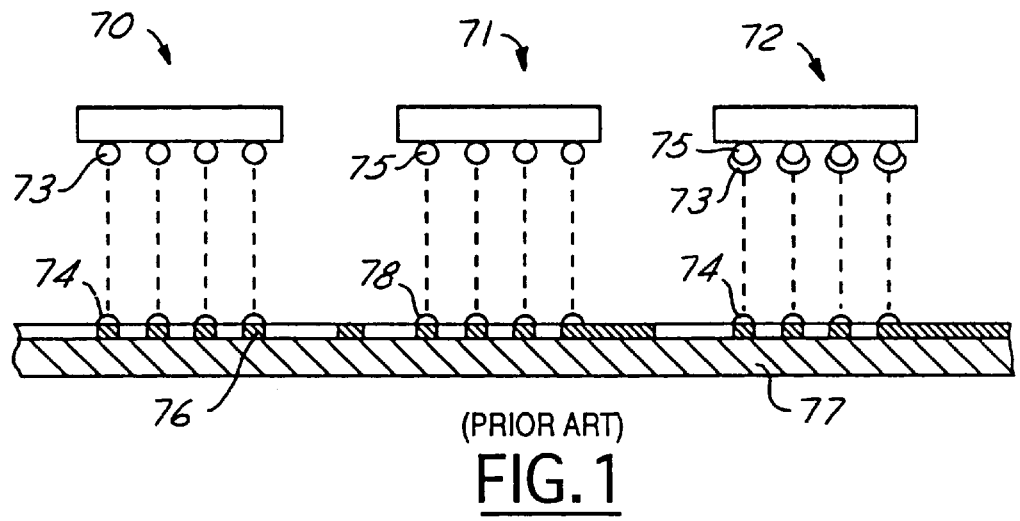
FIG. 1 is an elevation view of bump-terminated surface mount components and a substrate prior to being reflowed according to the prior art.
Figure 2A:
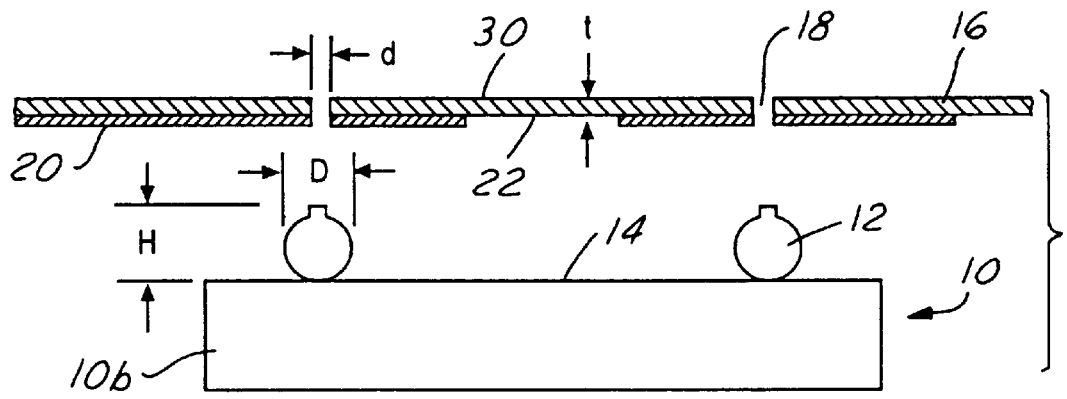
FIGS. 2A–2B are elevation section views of a bump-terminated surface mount component before and after being attached to a flexible substrate according to the present invention, respectively.
Figure 2B:
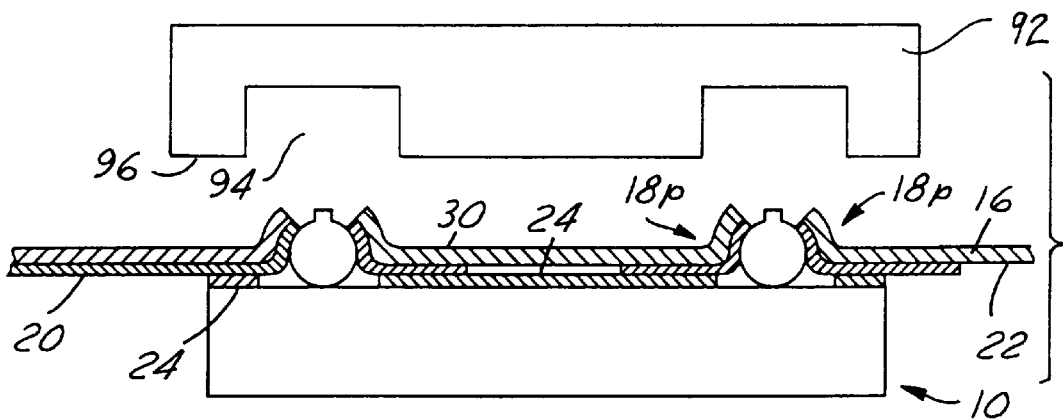

Referring now to the drawings, FIGS. 2A–B show an electronic circuit according to the present invention. A first embodiment of the circuit comprises: an electronic component 10 having bump terminations 12 on a first surface 14 thereof; a flexible substrate 16 having a plurality of generally round holes 18 therein arranged in correspondence with the bump terminations, wherein each hole has a diameter d smaller than the diameter D of a corresponding bump termination; and an array of conductive circuit traces 20 arranged on a second surface 22 of the substrate, wherein each of the circuit traces terminates generally about one of the holes 18 in the substrate 16. Each bump termination 12 is fixably inserted into its corresponding substrate hole 18 so as to mechanically connect the electronic component 10 with the substrate 16 and to electrically connect each termination 12 with a corresponding circuit trace 20.

Figure 3A:
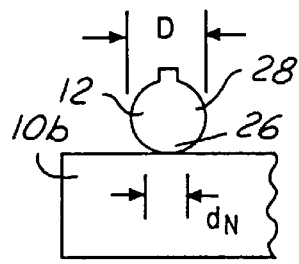
FIGS. 3A–3C are partial elevation views of alternate bump termination configurations according to the present invention.
Figure 3B:
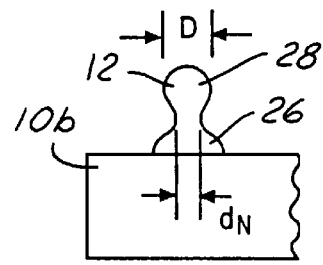
Figure 3C:
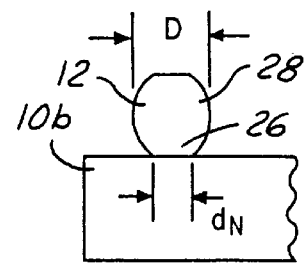

The electronic component 10 may be any electronic element, device, component, or support member which has bump terminations 12 on a surface 14 thereof, including (but not limited to) a conventional ball grid array (BGA) chip, a plastic or ceramic chip carrier, and a bumped FR-4 printed circuit board. These terminations 12 are preferably gold balls formed by a conventional ball bumping process, but may also be formed using different metals (e.g., aluminum) and/or by different processes (e.g., electroplating). The terminations 12 may assume a variety of shapes, including (but not limited to) the ball, pall, and barrel shapes illustrated in FIGS. 3A–C. The terminations 12 preferably have a generally bulbous profile having (1) a neck portion 26 attached to the component body 10b and having a diameter $d_N$, and (2) an end portion 28 distal from the component body 10b and having a diameter D, wherein $D > d_N > d$. With the diameter $d_N$ of the neck portion 26 being smaller than that D of the end portion 28, the neck portion 26 effectively serves as a kind of detent which holds the substrate 16 and component 10 together due to the compressive forces exerted by the hole periphery 18p against the termination 12 once the terminations have been inserted into their respective holes 18, as illustrated in FIG. 2B.

The flexible substrate 16 may be made from a variety of dielectric or insulative materials, such as polyimide (e.g., the material sold under the trademark KAPTON), polyester, (e.g., the material sold under the trademark MYLAR), epoxy composite, aramid, polyethylene, polyethylene terephthalate, polyethylene naphthalate, polyetherimide, polyvinyl difluoride, fluorinated ethylene-propylene copolymer, and similar materials. The substrate 16 preferably has a thickness t generally between 20% and 50% of the average bump height H, in order to provide sufficient flexure of the hole periphery 18p upon insertion of the terminations 12 through their corresponding substrate holes 18.

The generally round holes 18 are preferably circular in shape, but may also assume oval, ellipsoidal, "gear-toothed", or other round shapes as well. The holes 18 are preferably round so as to avoid any hole shape having corners (e.g., square holes), which might be more prone to produce tears in the substrate material from such corners. Such tears would be detrimental because they would reduce the compressive force exerted by the hole periphery 18p on the bump termination 12. Although the holes may have any diameter d smaller than the largest bump diameter D, they preferably have a diameter d which is generally 60% to 90% of the largest bump diameter D and which is smaller than the average neck diameter $d_N$.

An optional compliant layer 24 may be interposed between and in contact with the first surface 14 of the component 10 and a mating surface 22 of the substrate 16, as illustrated in FIG. 2B. The compliant layer 24 is preferably an electrically insulative adhesive-surfaced material, such as an adhesive-surfaced foam tape. The compliant layer 24 may be attached to the substrate mating surface 22 and/or the component mating surface 14, and may be used to assist the bump/hole interfaces in coupling the electronic component 10 with the flexible substrate 16.

Figure 4:
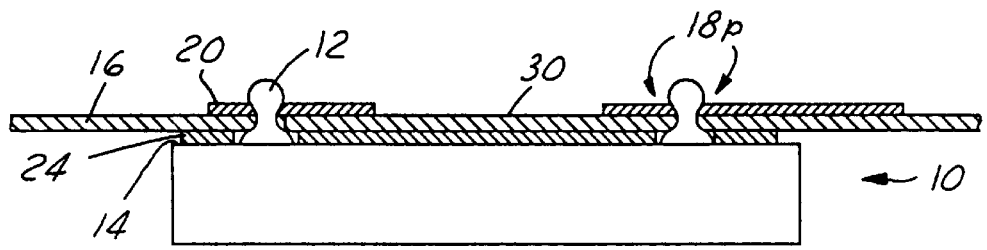
FIGS. 4–5 are elevation section views of two versions of a second embodiment of the present invention.
Figure 5:
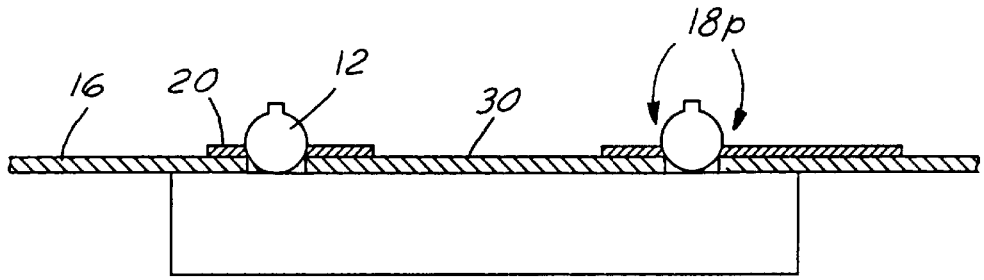
Figure 6:
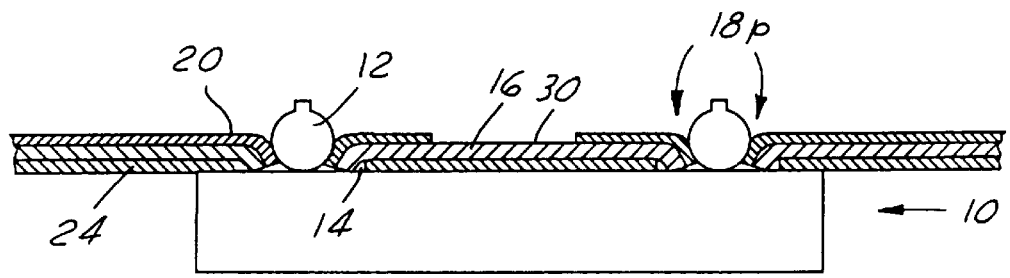
FIG. 6 is an elevation section view of a third embodiment of the present invention.

The array of conductive circuit traces 20 is arranged on a second surface of the substrate, with each of the circuit traces 20 terminating generally about one of the holes 18 in the substrate 16. In a first embodiment, as illustrated in FIG. 2B, the second surface is a mating surface 22 facing the first surface 14 of the electronic component 10. In this embodiment, the substrate 16 is oriented generally parallel with the first surface 14 of the electronic component 10, and a hole periphery 18p of the substrate immediately about each hole 18 is flared generally outward away from the first surface 14. In second and third embodiments, as shown in FIGS. 4–6, the second surface is an outer surface 30 of the substrate 16 facing away from the component first surface 14. Like in the first embodiment, the substrate 16 is again oriented generally parallel with the first surface 14, but in the second embodiment the hole periphery 18p is not substantially flared with respect to the chip first surface 14, as shown in FIGS. 4–5, or is flared generally inward toward the chip surface 14, as shown in the third embodiment in FIG. 6.

Figure 7:
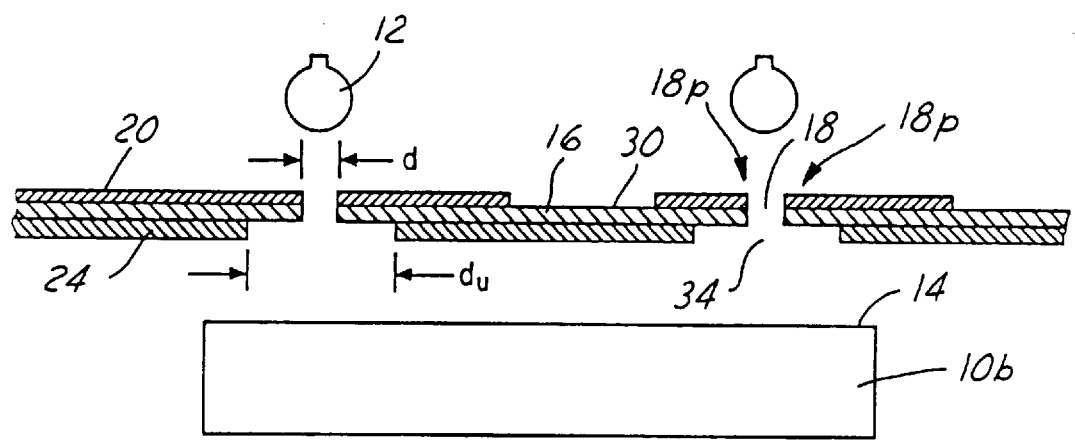
FIGS. 7–8 are elevation section views of two versions of a flexible substrate prior to attachment to a chip according to a third embodiment of the present invention.
Figure 8:
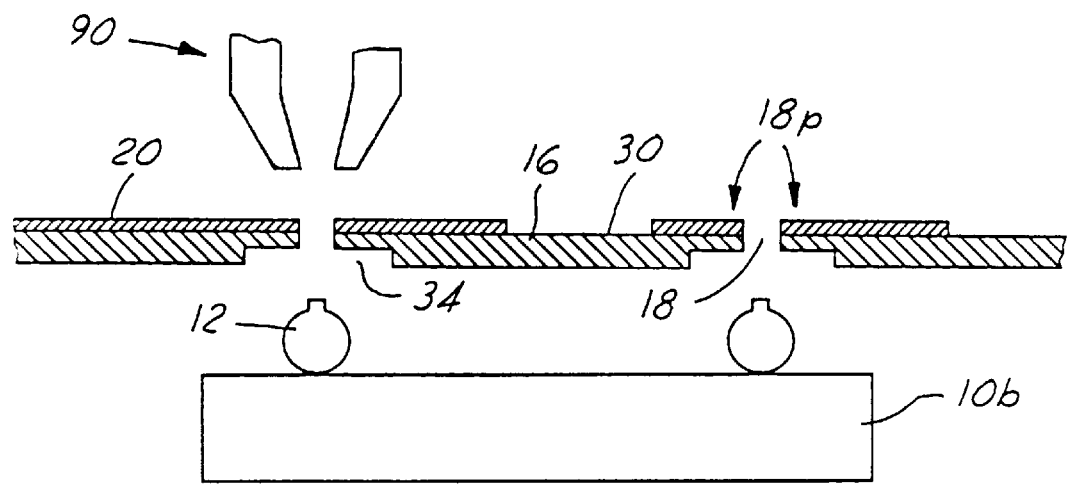

In the third embodiment (and optionally in the second embodiment, as shown in FIG. 4), a generally round undercut 34 in the substrate 16 or compliant layer 24 is provided in conjunction with each hole 18. Each undercut 34 is preferably concentric with its associated hole 18 and has a diameter $d_U$ larger than the diameter d of the corresponding substrate hole 18 and larger than the diameter D of the corresponding bump termination 12. The undercut 34 may be formed using either of two methods. A first method, as illustrated in FIG. 7, involves providing a compliant layer 24, having holes 34 of undercut diameter $d_U$, sandwiched between the substrate mating surface 22 and the chip mating surface 14, such that the undercut holes 34 are generally concentric with their respective substrate holes 18. A second method, as illustrated in FIG. 8, involves providing the undercuts 34 in the substrate 16 rather than in a compliant layer 24. In this second method, the undercut 34 would not be a through-hole, but would extend from the substrate mating surface 22 up through only a portion of the substrate thickness t.

The first embodiment may be formed as follows. First, the electronic component 10 having bump terminations 12, and the flexible substrate 16 having holes 18 therethrough and circuit traces 20 thereon, as shown in FIG. 2A and previously described above, are provided. Second, the chip 10 and substrate are aligned such that the substrate holes 18 are registered with their respective bump terminations 12, again as shown in FIG. 2A. Third, the substrate and chip are brought together such that the circuit traces 20 on the hole periphery 18p of the mating side 22 come into contact with their respective bump terminations 12. Fourth, the substrate and chip are further pressed together until each hole periphery 18p is flared generally outward by a respective bump termination 12. This essentially causes each hole periphery 18p to be stretched outward by a respective bump termination; or, looked at from another perspective, each bump termination is compressively gripped by a surrounding hole periphery, thus holding the chip and substrate together. Thus, each bump termination is fixably inserted into its corresponding substrate hole so as to mechanically connect the component with the substrate and to electrically connect each termination with a corresponding circuit trace.

The pressing together of the chip and substrate may be facilitated using a platen 92 as illustrated in FIG. 2B. The platen 92 preferably has a generally flat surface 96 with recesses 94 therein, wherein the recesses 96 are located in correspondence with the termination/hole periphery locations and are sized with sufficient depth and breadth so as to fit about but not in contact with each termination/hole periphery, while the flat surface 96 of the platen 92 may contact the non-hole-periphery substrate outer surface 30 and press the substrate toward the chip. An optional step of applying a compliant layer 24 between the substrate and chip may also be included. This compliant layer 24 may be first attached to the substrate mating surface 22, or to the chip mating surface 14, prior to the substrate and chip being pressed together. When no compliant layer 24 is used, the substrate and chip mating surfaces 22/14 are preferably pressed into contact with each other; however, they may alternatively be spaced somewhat apart, depending upon the dimensions and material characteristics of the substrate, the specific hole and bump termination dimensions, etc.

The second and third embodiments may be formed using a process generally similar to that used to make the first embodiment, with three general differences. First, the substrate provided for the second and third embodiments has circuit traces arranged on the substrate outer surface 30, rather than on the substrate mating surface 22. Second, the second or third embodiment may have undercuts 34 provided in the substrate/compliant layer, as described above. And third, whereas the hole periphery 18p in the first embodiment is flared generally outward away from the chip mating surface 14, in the second embodiment the hole periphery is not substantially flared, as shown in FIGS. 4 and 5, and in the third embodiment the hole periphery is flared generally inward toward the chip surface 14, as shown in FIG. 6. Like in the first embodiment, a platen or other tool may be used to press the substrate and chip into fixable engagement with one another, such that mechanical connection is provided between the substrate and chip and electrical connection provided between each bump termination 12 and a corresponding circuit trace 20. An optional compliant layer 24 may also be provided between the substrate and chip, as described above in the method for making the first embodiment. It may also be desirable to use a setting tool 90 or other means such as shown in FIG. 8 for pressing the hole periphery 18p about the bump termination 12 when the substrate and chip are being pressed together in order to achieve the degree of flare desired (i.e., substantially no relative flare for the second embodiment, and an inward flare for the third embodiment).

An alternative method for producing the second and third embodiments would be to first provide the chip without any bump terminations thereon, then to sandwich the substrate and chip (and optional compliant layer) together as desired, and then to utilize a conventional ball bumping process to attach a ball bump to the chip (e.g., to a bond pad on the chip) through each substrate hole, so as to "tack" the substrate (and optional compliant layer) against the chip. Note that FIG. 7 shows the bump terminations 12 as not-yet-attached ball bumps, thus illustrating how this "tacking" approach may be used in producing the third embodiment of the present invention.

In each of the above embodiments, the bump termination 12 protrudes above the outer surface 30 of the substrate after attachment of the substrate to the chip. This feature has the advantage that the protruding bump 12 may be used as a circuit test point, as a point of electrical contact to which other components or additional substrates may be attached, and so forth.

The circuit traces 20 arranged on the substrate may be conventional copper metallizations, tracks of cured conductive adhesive, or the like. Ideally each trace 20—or at least that portion of each trace on the hole periphery 18p which a bump termination 12 will contact—is made of gold and is used in conjunction with gold (or gold-coated) bump terminations 12, so that a cold weld may be formed between each gold trace/periphery and each gold termination.

It should be noted that in each of the three embodiments of the present invention described above, no heating of the substrate (or, for that matter, of any of the mentioned elements) is required; nor is there a need to subject any element or assembly of the invention to reflow or other elevated temperatures. Thus, the present invention achieves mechanical attachment of the chip to the substrate, and electrical connection of each chip termination with its respective circuit trace, without the need of subjecting any of the elements comprising the invention to elevated processing temperatures.

Various other modifications to the present invention will, no doubt, occur to those skilled in the art to which the present invention pertains. For example, when in the first, second, and third embodiments the substrate 16 is described as being generally parallel with the component first surface 14, it is intended that only that portion of the substrate immediately about the component 10 should be generally parallel with the component surface 14. However, parts of the substrate 16 other than the portion immediately about the component may not necessarily be parallel with the component first surface 14, such as when the flexible substrate 16 is attached to a non-planar mounting substrate. Also, it should be noted that the hole periphery 18p generally includes those portions of both the substrate 16 and circuit traces 20 immediately about or adjacent to each hole 18. However, it is possible that not every hole 18 has a circuit trace adjacent thereto; some hole-and-termination combinations may be provided without a circuit trace adjacent thereto where such combination is provided merely for added mechanical attachment and where electrical connection is either not needed, or is to be provided between the protruding bump termination and some electrical element (e.g., a jumper wire, another component, another substrate) external to the instant chip-substrate combination. It is the following claims, including all equivalents, which define the scope of the present invention.

What is claimed is:

1. An electronic circuit, comprising:
    an electronic component having bump terminations on a first surface thereof;
    a flexible substrate having a plurality of generally round holes therein arranged in correspondence with said bump terminations, wherein each of said holes is defined by a hole periphery of said substrate immediately about each hole, wherein each hole has a diameter d smaller than a largest diameter D of a corresponding bump termination; and
    an array of conductive circuit traces arranged on a second surface of said substrate, wherein each of said circuit traces terminates proximate one of the holes in said substrate;
    each bump terminator being fixably inserted into its corresponding hole in said substrate so as to stretch its corresponding hole periphery and enlarge said corresponding hole, thereby providing a compressive gripping force exerted by each stretched hole periphery on its corresponding bump termination, so as to mechanically connect said electronic component with said substrate and to electrically connect each termination with a corresponding circuit trace.

2. An electronic circuit according to claim 1, wherein said bump terminations are formed by ball bumping.

3. An electronic circuit according to claim 1, wherein said bump terminations have an average bump height and wherein said substrate has a thickness between 20% and 50% of the average bump height inclusive.

4. An electronic circuit according to claim 1, further comprising a compliant layer of electrically insulative adhesive-surfaced material interposed between and in contact with said first surface of said electronic component and a mating surface of said substrate.

5. An electronic circuit according to claim 1, wherein said flexible substrate is formed from a material selected from the group consisting of polyimide, polyester, epoxy composite, aramid, polyethylene, polyethylene terephthalate, polyethylene naphthalate, polyetherimide, polyvinyl difluoride, and fluorinated ethylene-propylene copolymer.

6. An electronic circuit according to claim 1, wherein each bump termination has a bulbous profile having:
   a neck portion attached to said substrate and having a diameter $d_N$; and
   an end portion distal from said substrate and having said diameter D;
   wherein $D > d_N > d$.

7. An electronic circuit according to claim 1, wherein said second surface of said substrate is a mating surface facing toward said first surface of said electronic component.

8. An electronic circuit according to claim 1, wherein said second surface of said substrate is an outer surface facing away from said first surface of said electronic component.

9. An electronic circuit according to claim 1, wherein at least an outer portion of each bump termination is made of gold.

10. An electronic circuit according to claim 1, wherein each hole in said substrate is substantially circular.

11. An electronic circuit according to claim 4, wherein said compliant layer comprises an adhesive-surfaced foam tape.

12. An electronic circuit according to claim 7, wherein said substrate is oriented substantially parallel with said first surface of said electronic component, and wherein said hole periphery of said substrate immediately about each hole is flared outward away from said first surface.

13. An electronic circuit according to claim 8, wherein said substrate is oriented substantially parallel with said first surface of said electronic component, and wherein a hole periphery of said substrate immediately about each hole is generally not flared with respect to said first surface.

14. An electronic circuit according to claim 8, wherein said substrate is oriented substantially parallel with said first surface of said electronic component, and wherein a hole periphery of said substrate immediately about each hole is flared generally inward toward said first surface.

15. An electronic circuit according to claim 9, wherein at least a portion of each circuit trace adjacent each hole in said substrate is made of gold.

16. An electronic circuit, comprising:
   an electronic component having bump terminations on a first surface thereof,
   a flexible substrate having a plurality of generally round holes therein arranged in correspondence with said bump terminations, wherein each of said holes is defined by a hole periphery of said substrate immediately about each hole, wherein each hole has a diameter d smaller than a largest diameter D of a corresponding bump termination; and
   an array of conductive circuit traces arranged on a second surface of said substrate, wherein each of said circuit traces terminates proximate one of the holes in said substrate;
   wherein each bump termination has a substantially bulbous profile having:
      a neck portion attached to said substrate and having a diameter $d_N$, and
      an end portion distal from said substrate and having a diameter D,
      wherein $D > d_N > d$;
   each bump termination being fixably inserted into its corresponding hole in said substrate so as to stretch its corresponding hole periphery and enlarge said corresponding hole, thereby providing a compressive gripping force exerted by each stretched hole periphery on its corresponding bump termination, so as to mechanically connect said electronic component with said substrate and to electrically connect each termination with a corresponding circuit trace.

17. An electronic circuit according to claim 16, wherein said bump terminations have an average bump height and wherein said substrate has a thickness between 20% and 50% of the average bump height inclusive.

18. An electronic circuit according to claim 16, further comprising a compliant layer of electrically insulative adhesive-surfaced material interposed between and in contact with said first surface of said electronic component and a mating surface of said substrate.

19. An electronic circuit according to claim 16, wherein said second surface of said substrate is a mating surface facing toward said first surface of said electronic component, and wherein said substrate is oriented substantially parallel with said first surface of said electronic component, and wherein said hole periphery of said substrate immediately about each hole is flared generally outward away from said first surface.

20. An electronic circuit, comprising:
   an electronic component having bump terminations on a first surface thereof;
   a flexible substrate having a plurality of generally round holes therein arranged in correspondence with said bump terminations, wherein each of said holes is defined by a hole periphery of said substrate immediately about each hole, wherein each hole has a diameter d smaller than a largest diameter D of a corresponding bump termination; and
   an array of conductive circuit traces arranged on a second surface of said substrate, wherein each of said circuit traces terminates proximate one of the holes in said substrate;
   wherein each bump termination has a substantially bulbous profile having:
      a neck portion attached to said substrate and having a diameter $d_N$, and
      an end portion distal form said substrate and having a diameter D,
      wherein $D > d_N > d$;
   wherein said bump terminations have an average bump height and wherein said substrate has a thickness between 20% and 50% of the average bump height, inclusive;
   each bump termination being fixably inserted into its corresponding hole in said substrate so as to stretch its corresponding hole periphery and enlarge said corresponding hole, thereby providing a compressive gripping force exerted by each stretched hole periphery on its corresponding bump termination, so as to mechanically connect said electronic component with said substrate and to electrically connect each termination with a corresponding circuit trace.

* * * * *